United States Patent [19]
Nagazumi

[11] Patent Number: 5,936,567
[45] Date of Patent: Aug. 10, 1999

[54] PARALLEL CHARGE SIGNAL DELIVERY SYSTEM, AND FILTERING AD CONVERTER USING THE SAME

[75] Inventor: Yasuo Nagazumi, 6th Fl. Watanabe Bldg., 20-13 Akasaka 2-chome Minato-ku, Tokyo 107, Japan

[73] Assignees: G.D.S. Co., Ltd.; Yasuo Nagazumi, both of Tokyo, Japan

[21] Appl. No.: 08/950,589

[22] Filed: Oct. 15, 1997

[30] Foreign Application Priority Data

Oct. 16, 1996 [JP] Japan ................................. 8-294387

[51] Int. Cl.[6] .................................................... H03M 1/36
[52] U.S. Cl. ............................................ 341/172; 341/155
[58] Field of Search ................................... 341/172, 155, 341/156, 159, 161, 100, 101

[56] References Cited

U.S. PATENT DOCUMENTS

| | | | |
|---|---|---|---|
| 4,471,341 | 9/1984 | Sauer | 341/161 |
| 5,537,115 | 7/1996 | Nagazumi | 341/172 |
| 5,539,404 | 7/1996 | Nagazumi | 341/150 |

FOREIGN PATENT DOCUMENTS

6-164320   6/1994   Japan .

OTHER PUBLICATIONS

Yasuo Nagazumi, "A Charge–Domain D/A Conversion System", IEICE Transactions on Fundamentals of Electronics, Communications and Computer Sciences (vol. E79–A, No. 2, Feb. 1996, pp. 217–223.

*Primary Examiner*—Brian Young

[57] ABSTRACT

A data supply method for performing exact operations by a number of operation units receiving a single signal as input is proposed; and a composition of a system provided with both the filter function and the AD conversion function using the same is also proposed. The system comprises a charge signal supply unit, which is a charge splitter composed of charge transfer devices for splitting a input charge signal into N signal charge parts, for supplying as input for said charge splitter S (S is an integer equal or superior to 2) series of source time series charge signals as a single time series signal by multiplexing the same by the time division multiplexing; and a demultiplexing mechanism for taking as respective inputs the N outputs from said charge splitter, and for separating multiplexed S series of time series charge signals contained in this input to convert them into an independent time series signals.

9 Claims, 6 Drawing Sheets

PARALLEL CHARGE SIGNAL DELIVERY SYSTEM, AND FILTERING AD CONVERTER USING THE SAME

BACKGROUND OF THE INVENTION

1. Field of the Invention

The present invention relates to parallel charge signal delivery system useful for communications equipment, signal processor or the like, and a filtering AD converter using the same.

2. Prior Art

As a result of the development of the digital technology, the digital modulation method such as CMDA (Code Division Multiple Access) has rapidly come into wide use; however, the advanced function level required for the system if gradually attaining such a high level that can hardly realized by a method using the digital processing which has been used up to now in terms of system size or power consumption, and more particularly, this problem has already became obvious in the application such as mobile terminal restricted by the power supply.

As an approach to resolve these problems, novel methods have been developed, such as described in the TOKKAIHEI 6-164320, wherein the analog processing is introduced in order to slough off the inefficient power consumption inherent in the conventional digital signal processing.

However, in general, when these are to be realized by a conventional analog signal processing method, the matching problem of devices composing the circuit is extremely important, constituting a serious restrictive condition for the enlargement of the system scale and the minimization of the integrated circuit.

As new solutions to resolve problems inherent in the analog signal processing method as mentioned before, the U.S. Pat. No. 5,539,404 and U.S. Pat. No. 5,537,115 propose signal processing methods using charge transfer devices. These methods are innovative wherein input charge signals are all processed in the charge domain and the system accuracy is determined independently of the circuit manufacturing error. Then, they are considered to consume less power than conventional analog signal processing methods, because they need, in principle, no active device. On the contrary, as these methods consist in forming the output by processing directly input charge signals, they require an exclusive signal duplication technology for using a single input signal to a large number of operations.

For the detail of this technology, please refer to the journal in English published by the Society of Electronic Information Communication (VOL. E79-A, No. 2, February 1996, pp 217–223) of an Incorporated Foundation.

As an example of this, the applicant of the present invention has proposed a method, in the Application Japanese Patent Application Laid Open No Hei 8-174266, comprising the steps of digitizing once the input charge signal and duplicating the charge signal by a plurality of DA converters receiving reference charge signal from a common reference charge signal generator; however, in this case, the degree of parallelism of the whole is restricted by the number of reference charge signal which can be supplied within the unit time and the degree of system parallelism can not be determined as desired to constitute a serious restrictive condition for the enlargement of the system scale.

Moreover, this method has disadvantageous composition in terms of operation time or power consumption, since essentially unnecessary DA and AD conversion are required for the signal duplication.

It is an object of the present invention to propose a data supply method for executing an accurate operation by a number of operation devices taking a single signal as input and also to propose the composition of an unit having both the filter function and the AD converter function, using this method.

SUMMARY OF THE INVENTION

In view of the problems as mentioned before, the object of the present invention is attained by a main invention comprising a parallel charge signal delivery system and a filtering AD converter: wherein the parallel charge signal delivery system comprises a charge signal supply unit, which is a charge split device composed of charge transfer devices for splitting a input charge signal into N signal charge parts, for supplying as input for said charge split device S (S is an integer equal or superior to 2) series of source time series charge signal as a single time series signal by multiplexing the same by the time division multiplexing; and a demultiplexing mechanism for taking as respective inputs the N outputs from said charge split device, for separating multiplexed S series of time series charge signals contained in this input to convert them into an independent time series signal;

and the filtering AD converter comprises a charge signal processor and an AD converter, in which the charge signal processor executes the operation using at least as part of input signal a part of S series of time series charge signals consisting N sets, generated by said parallel charge signal delivery system to output output signals with a form of charge signal; and the AD converter receives as an input signal the output from said charge signal processor directly or intermittently with a given interval using a charge accumulator and takes as a reference signal the reference charge signal series among them to execute the AD conversion as an input signal the other time series charge signal.

Now the function of the present invention will be described.

For the splitting of the charge signal, for example, the dynamic splitting method and other well-known approaches exist; however it is taken for granted that their accuracy lowers when the unit is minimized.

Consequently, when the analog operation is performed by using simply the results of the splitting processing by such unit, its splitting error inevitably influences the results of the processing. Thus, it is indispensable to enlarge the circuit size in order to ensure the required accuracy.

However, this splitting error can be compensated theoretically by digitizing the analog output of the result of operation processing mentioned above, by using the reference charge signal processed in the same charge split device.

Namely, for performing N splits, suppose the splitting ratio b n1/N, n2/N . . . nN/N, provided that n1+n2+ . . . nN=N, the input charge Qin and the reference charge Pref, n splitting outputs Qi, Pi for respective one will be:

Q1=n1·Qin/N, P1=n1·Pref/N

Q1=n2·Qin/N, P2=n2·Pref/N

Q1=nN·Qin/N, PN=nN·Pref/N

As the input charge signal is time series signal, the Qi, Pi mentioned above become respectively times series signal, while all data being multiplied by ni/N, and the output signal of the sum or product operation or others among them has also the coefficient ni/N.

Here, suppose that the operation output is AD-converted by taking the accumulated value of Pi as the reference charge signal, as the AD conversion may be considered as the process for getting the digital output signal by dividing the analog input signal by the reference analog signal, it is understood that the coefficient ni/N common to the denominator and the numerator is offset to give theoretically no influence to the accuracy.

This theory can equally be applied to the case where N charge input gates are operated in parallel to generate N series of the charge signal by expressing the difference in a voltage charge conversion property of respective charge input gates by ni/N similarly as mentioned above.

DETAILED DESCRIPTION OF THE PREFERRED EMBODIMENTS

Now, one embodiment of the present invention will be described with reference to the accompanied drawings.

Figure 1:
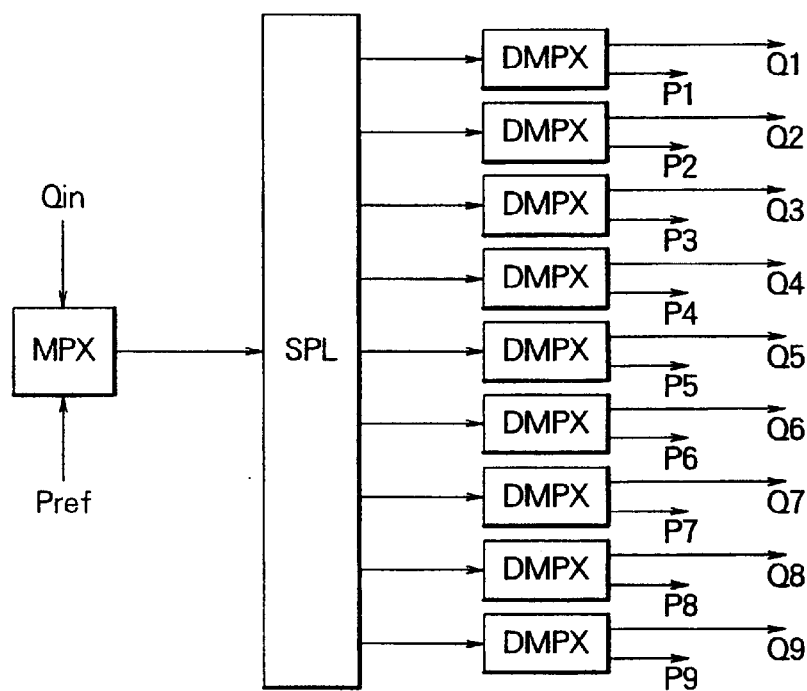
FIG. 1 is a composition diagram of a parallel charge signal supply system wherein a charge split device of one embodiment according to the present invention is used.
Figure 2:
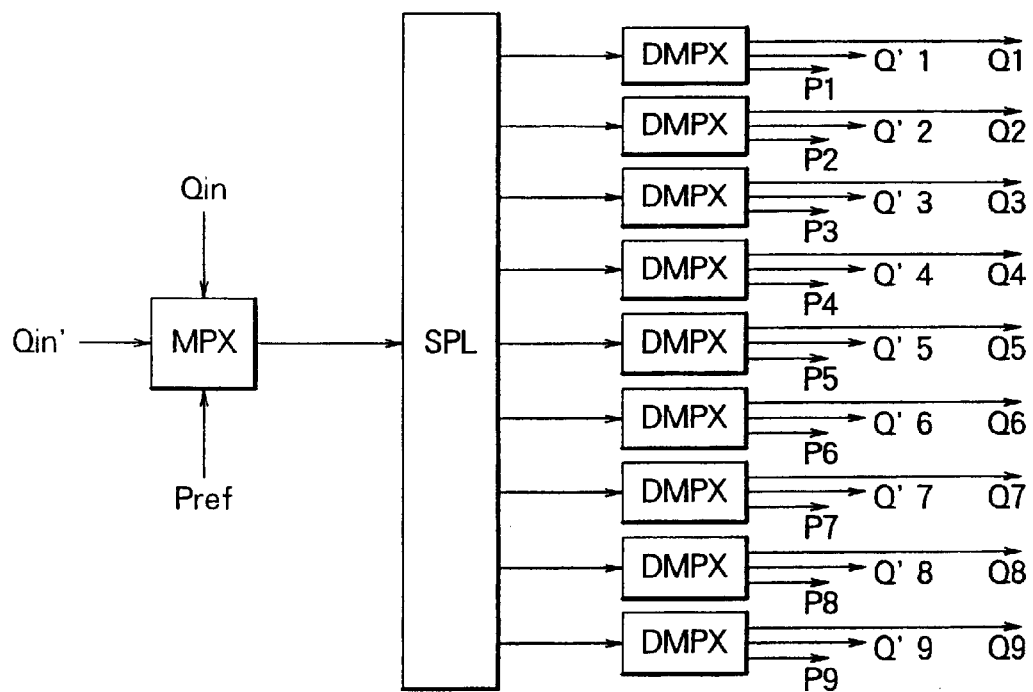
FIG. 2 is a composition diagram showing a composition of a parallel charge signal supply system wherein a charge split device of another embodiment according to the present invention is used.
Figure 3:
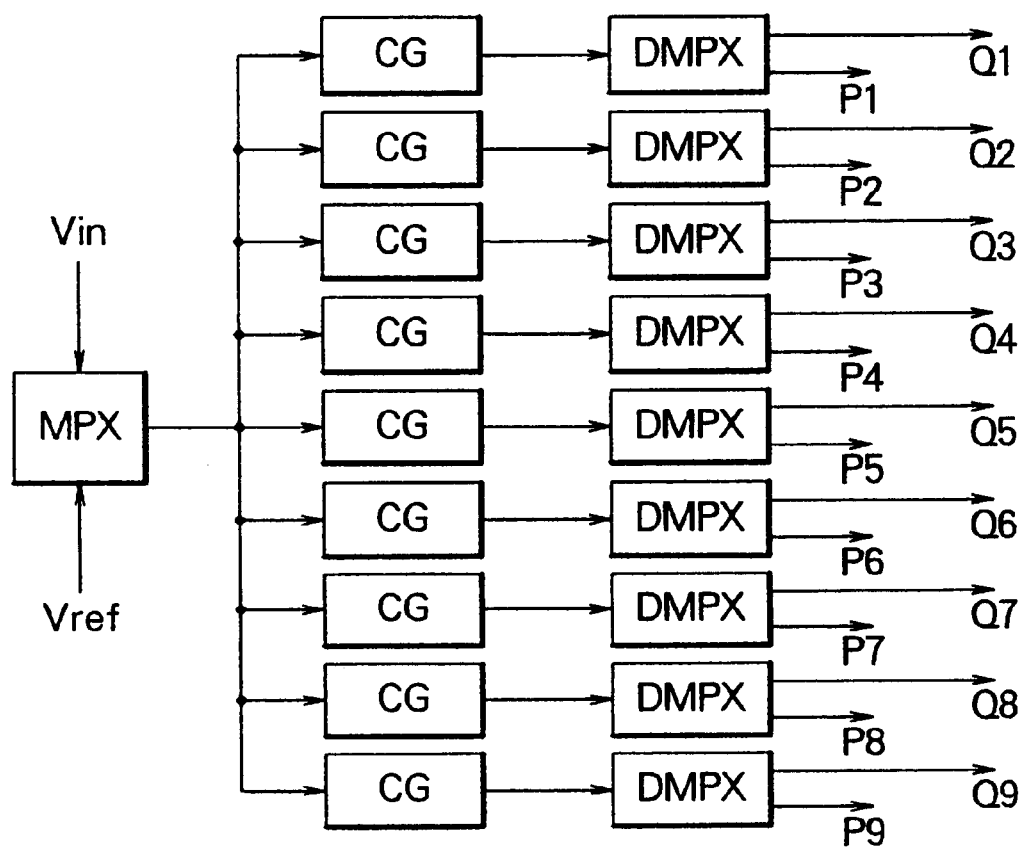
FIG. 3 is a composition diagram showing a composition of a parallel charge signal supply system wherein further another charge input gate array is used.

FIG. 1 to FIG. 3 illustrates respective compositions of the parallel charge signal delivery system for the case where the charge split device is employed and for the case where the charge input gate array is employed.

In FIG. 1, an input signal charge Qin and a reference signal charge Pref composing two series of source time series charge signal are multiplexed by a multiplexer MPX, delivered to a charge split device SPL, and separated into a component of the reference signal Pref and a component of the input signal Qin by a demultiplexer DMPX after the separating into N time series signals.

FIG. 2 shows the case where differential signals Qin, Qin' and a reference signal Pref composing three series of source time series charge signal are similarly multiplexed by the multiplexer MPX.

FIG. 3 shows the composition where a charge input gate array is adopted.

In FIG. 3, it is composed so as to multiply an input voltage Vin and a reference voltage Vref by a multiplexer MPX and to generate an output signal where charge signals of Qi and Pi are arranged alternatively at the i-th charge input gate by the control of connected n charge input gates CG. As for this output signal, similarly to FIG. 1, an input signal component and a reference signal component are output as separate time series respectively by a demultiplexer DMPX.

Figure 4:
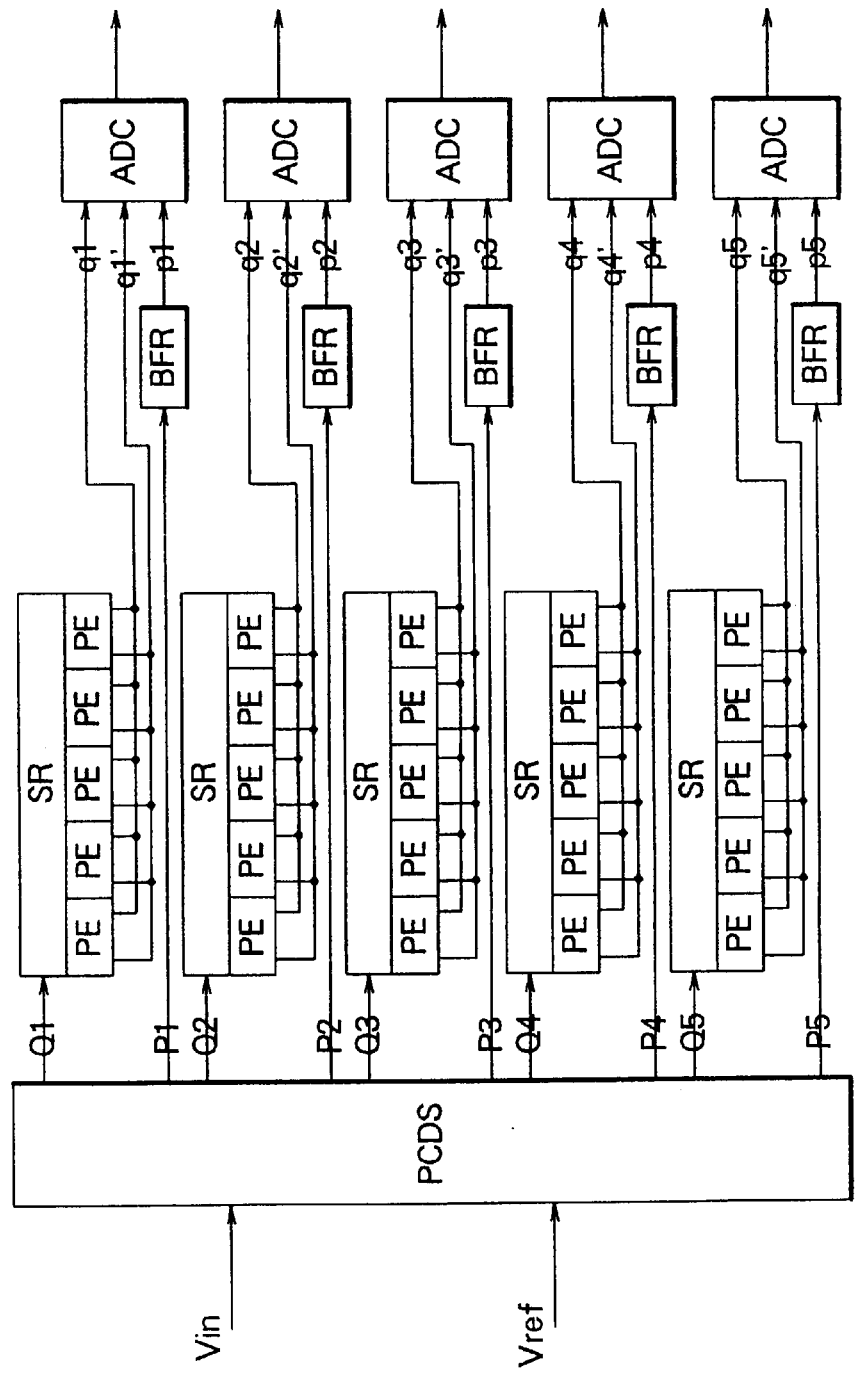
FIG. 4 is a composition diagram of the simplest composition of filtering AD converter wherein a parallel charge signal supply system of one embodiment according to the present invention is combined with a charge signal operation unit and an AD converter taking the charge signal as input.

FIG. 4 shows an example of the simplest composition of a filtering AD converter wherein said parallel charge signal delivery system is combined with a charge signal arithmetic unit and an AD converter taking charge signal as input.

In FIG. 4, among two series of element signal series Qi and Pi composing the i-th output generated by the parallel charge signal delivery system PCDS, Qi is supplied as input signal to M charge signal multiplication units PE in an analog shift register SR, and a multiplication processing is executed in parallel with a digital coefficient signal (not shown) supplied separately, and respective charge output signals are added to generate sum and product output charge signals qi, qi' having a differential form, supposing that the charge signal multiplication unit PE be two quadrant multiplier. On the other hand, as for Pi, M sets of Pi are accumulated in a buffer BFR to form an accumulated reference charge signal pi.

These charge signals are eventually converted to the digital output signal in an AD converter ADC. At this juncture, as the input charge signal and the reference charge signal used for the conversion are respectively supplied from the parallel charge signal delivery system having the same error factor, this error does not influence the digital output signal.

Figure 5:
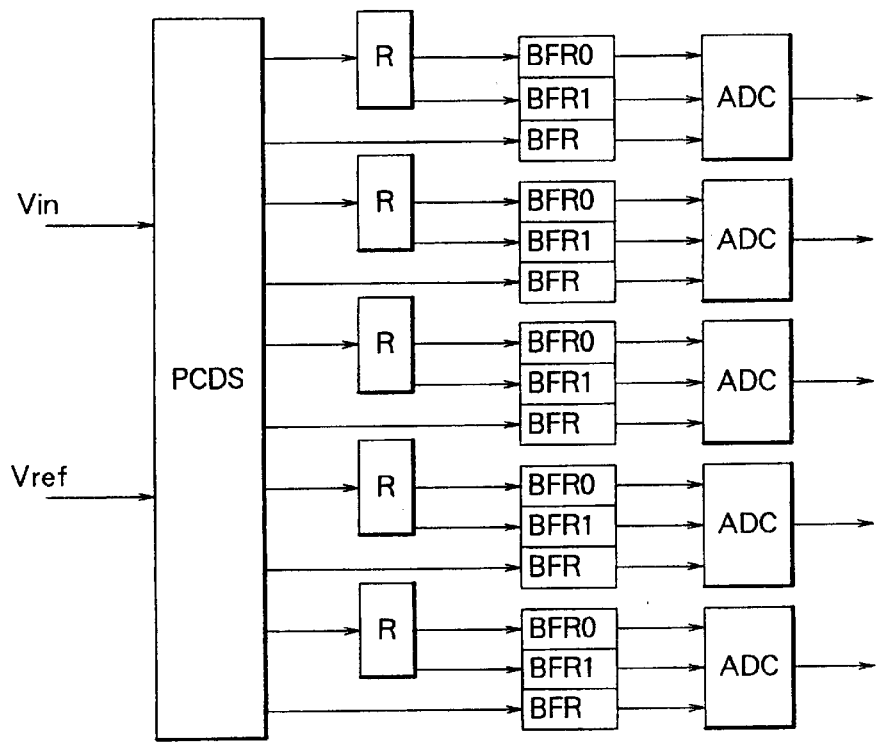
FIG. 5 is a composition diagram of an example that the composition according to the present invention is applied to a matched filter for computing he correlation between a binary reference code signal and an analog input signal.

FIG. 5 shows an example of the composition of the system according to the present application which is applied to a matched filter for computing the correlation between the binary reference code signal and the analog input signal.

This example has, basically, a similar composition to the examples as illustrate by FIG. 4 except that a charge signal routing mechanism is adopted as charge signal processor in place of the multiplication unit, and the input charge signal output from a demultiplexing unit is accumulated selectively in two buffers BFR0, BFR1 sequentially according to one bit matching code signal supplied separately in a routing mechanism R.

Compared to the multiplication unit used in the system as illustrated by FIG. 4, since the routing mechanism R operates rapidly and no paralyzation is necessary, therefore the analog shift register SR which is adopted for the system illustrated by FIG. 4 is omitted from the composition of the system illustrated by FIG. 5.

In the composition as shown in FIG. 5, since both the demultiplexer DMPX disposed at the last stage of the parallel charge signal supply system PCDS and the routing mechanism R for grouping charge signals according to the matching code are the parts for performing a similar function of controlling the charge packet transfer direction, it is obvious that they are equal in terms of their function even if they are composed integrally or their order is changed.

In general, as for the charge transfer device, the charge amount that can be accumulated per circuit area is limited and a larger circuit area is required when the amount of charge signal increases and, as a result, the time necessary for the transfer tends to increase as much. Thus, it is undesirable on operation time to treat unnecessarily a large amount of charge signals.

Figure 6:
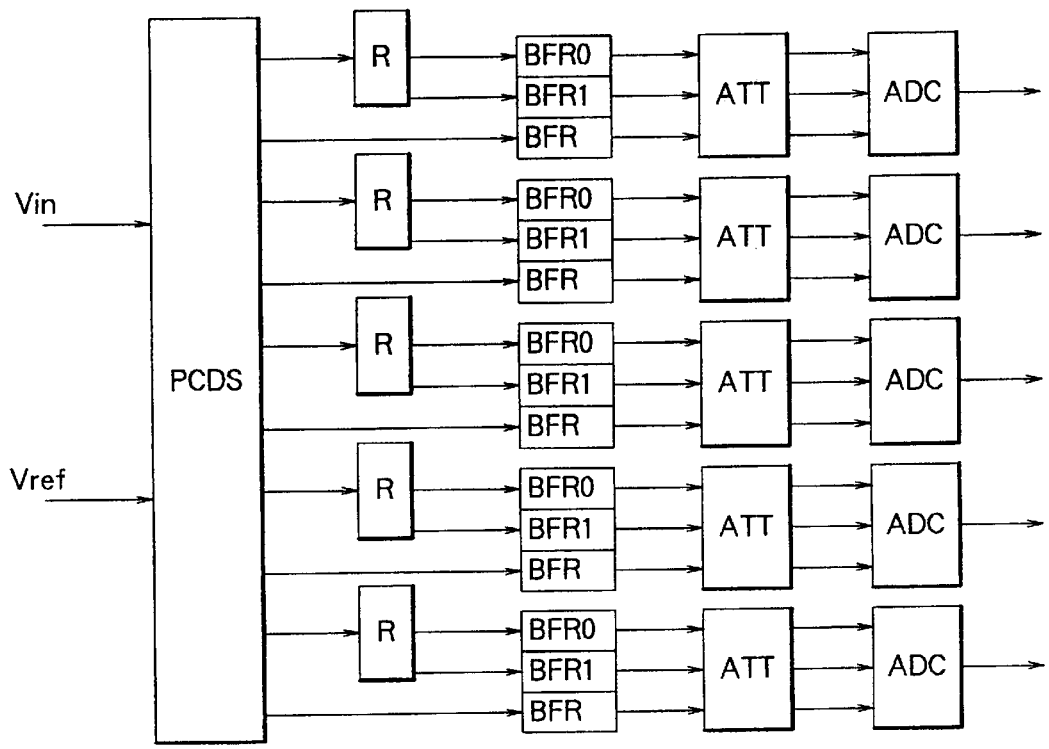
FIG. 6 is a composition diagram which is adopted for the example as shown in FIG. 5, wherein the input charge signal and the reference charge signal to be used for the AD conversion are supplied to the AD converter through a same charge signal attenuator.

To resolve this problem of the examples shown by FIG. 5, FIG. 6 illustrates the example of the system which is adopted an composition wherein the input charge signal to be used for the AD conversion and the reference charge signal are supplied to an AD converter through a same charge signal attenuator. In this case, as the characteristic error of the attenuator unit influences both the input charges signal and the reference charge signal, it is evident that it is offset to give no influence to the output signal.

On determining the correlation with an extremely long matching code, two buffers BFR0, and BFR1 for accumulating the correlating result require to accumulate a particular huge amount of charge, and results in a disadvantage condition for a circuit area.

Figure 7:
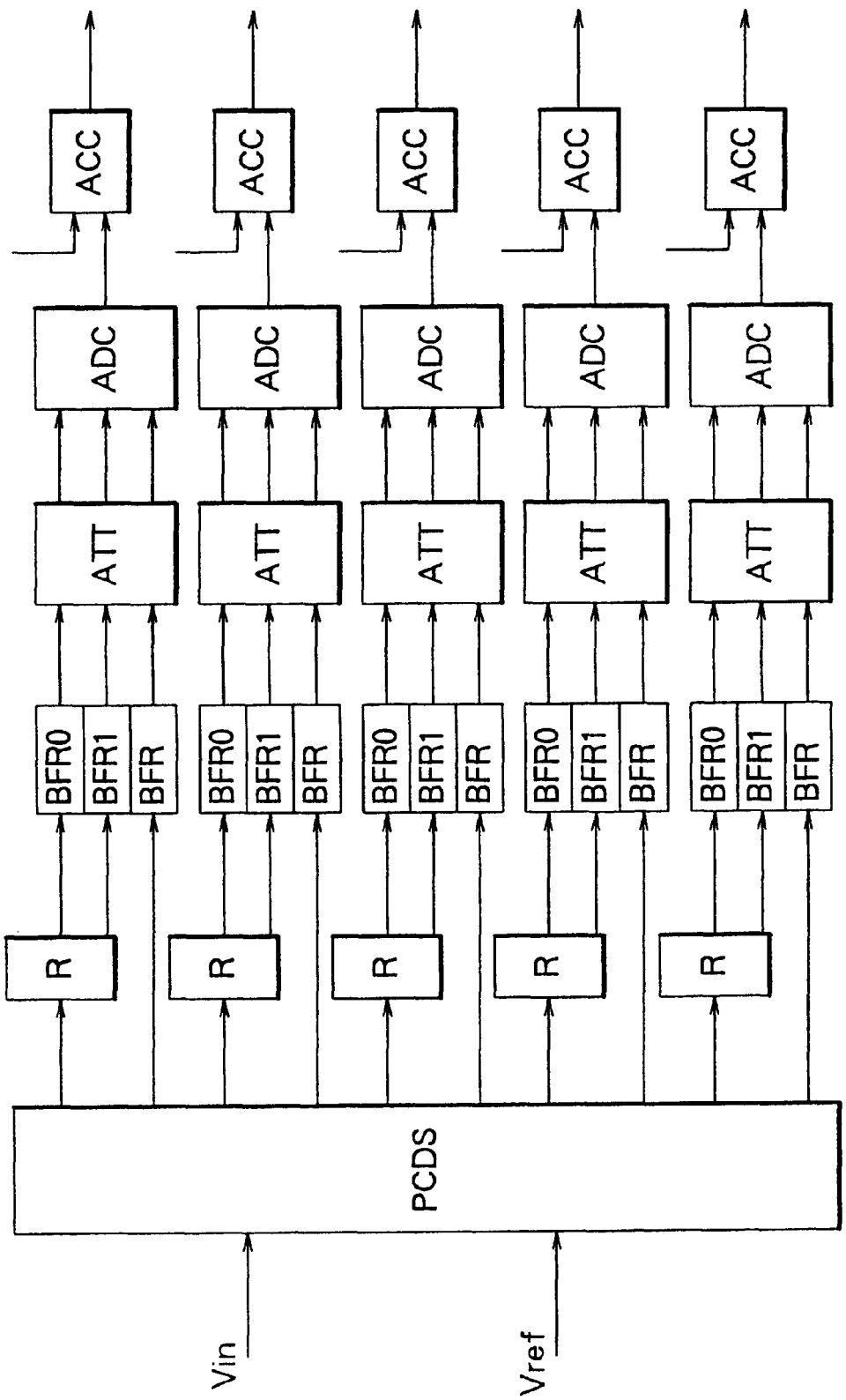
FIG. 7 is a composition diagram of an example of the composition of the present invention for computer the matching data of the whole by adding the partial correlation data with the matching code in the domain of digital signal.

In order to avoid this problem, FIG. 7 shows an example of the composition for computing the whole matching data by adding partial correlation data with the matching code in the domain of digital signal.

Figure 8:
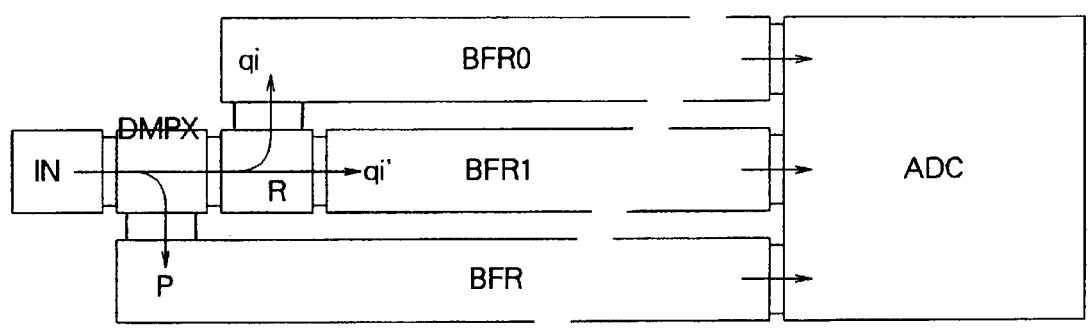
FIG. 8 is a composition diagram of an example of a concrete arithmetic circuit of the present invention composed by using the CCD gate.

FIG. 8 shows an example of a concrete operation circuit composed by using the CCD gate. In FIG. 8, the multiplex charge signal split by a charge split device SPL is input from the leftmost IN, split into two series of times series charge signal of the reference charge signal P and input charge signals qi, qi' by a demultiplexer DMPX, and the reference charge signal p is cumulatively added in a buffer BFR.

On the other hand, the input charge signal qi, qi' is supplied to a routing mechanism R and cumulatively added to either of buffers BFR0 or BFR1 selectively, according to the digital signal bit of the matching code separately supplied to the routing mechanism R.

In this way, the charge signal accumulated in three buffers for a given period is supplied to an AD converter ADC and then converted into a digital output signal.

Figure 9:
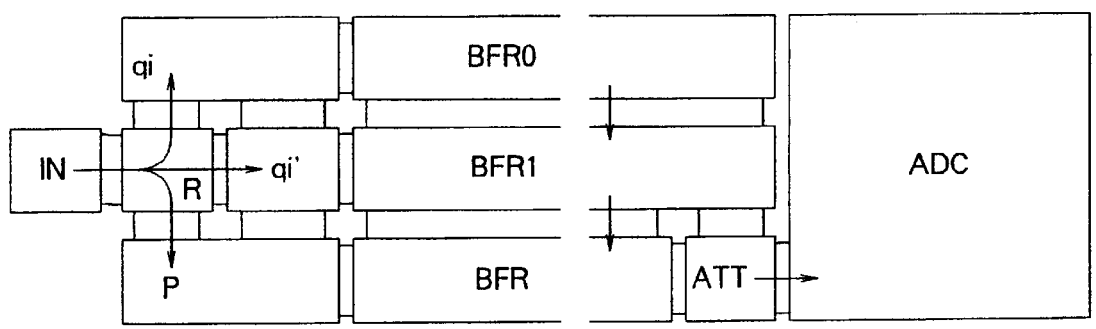
FIG. 9 is a composition diagram of another example of a concrete arithmetic circuit of the present invention composed by using the CCD gate.

FIG. 9 illustrates the system composition example using the CCD gate as the system shown in FIG. 8, and this example shows a composition adopting a three-way output routing mechanism R which has both functions as demultiplexer and routing mechanism.

In the case of this example, three buffers are linked with a control gate and the output to an AD converter ADC is supplied through an attenuator ATT disposed at the right end of the buffer BFR.

Namely, when the matching operation is finished, the charge signal accumulated in three buffers are transferred from BFR0, BFR1 to the direction of BFR, the attenuation processing is applied according to the area ratio by the split processing after the redistribution of charge by the buffer BFR and the attenuator, and then they are input consecutively to the AD converter ADC.

Further in the two examples mentioned above, it is shown the case where the output is supplied to the AD converter ADC in the charge packet form; while, for the case that an Ad converter ADC requiring in the voltage form input is adopted, for instance, the composition of FIG. 9 may be so modified that the attenuator ATT is omitted and, moreover, by disposing a floating electrode is omitted on the buffer BFR so as to consecutively measure of the charge amount, and the voltage output can be easily obtained.

The charge transfer represented by the CCD is known as a signal processor having an advantage of extremely low power consumption, because the electric current is not used as the media for signal transmission therefor.

The present invention uses this charge transfer device for realizing the filter function in the charge domain and necessarily allows to compose a device of which power consumption is, extremely low in comparison to the conventional art.

In addition, the circuit composition being simple, it provides an extremely effective technical means for reducing the required area on the integrated circuit. More particularly, it may be adopted very advantageously for the application of CDMA decoder used for the mobile terminal or the like.

What is claimed is:

1. A parallel charge signal delivery system comprising:
    a charge signal supply unit, which is a charge split device composed of charge transfer devices for splitting a input charge signal into N signal charge parts, for supplying as inputs for said charge split device S (S is an integer equal or superior to 2) series of source time series charge signals as a single time series signal by multiplexing the same by a time division multiplexing; and
    a demultiplexing mechanism for taking as respective inputs N outputs from said charge split device, and for separating multiplexed S series of time series charge signals contained in said inputs to convert them into an independent time series signal.

2. The parallel charge signal delivery system as claimed in claim 1, wherein:
    at least one series in said S series of source time series charge signals is a reference charge signal series generated by a same reference charge signal generator.

3. A parallel charge signal delivery system comprising:
    a controlled voltage generation source for generating a multiplexed voltage signal series wherein a reference voltage signal and S series of voltage signals which contain input voltage signals constituting a time series are multiplexed periodically;
    N charge signal generators taking said multiplexed voltage signal series as common input voltage signal, having substantially same voltage/charge conversion properties and being composed of a charge transfer device; and
    a demultiplexing mechanism for taking as respective inputs N outputs from said charge signal generator, and for separating multiplexed S series of time series charge signals contained in said inputs to convert them into an independent time series signal.

4. A filtering AD converter, comprising:
    a charge signal processor for executing operations using at least as a part of input signals a part of S series of time series charge signals composing N sets to output a signal output therefrom with a form of charge signal, wherein S series of time series charge signals are generated by said parallel charge signal delivery system as claimed in any of claims 1 to 3; and
    an AD converter for receiving as an input signal an output from said charge signal processor directly or intermittently with a given interval using a charge accumulator and for executing the AD conversion taking as reference signals a reference charge signal series among them and taking as input signals the other time series charge signals.

5. The filtering AD converter as claimed in claim 4, further comprising a charge signal attenuator, wherein said reference signal and said input signal used for said AD conversion in at least one AD converter are processed in said charge signal attenuator, so as to adjust an input signal level.

6. The filtering AD converter as claimed in claim 4, further comprising an array of charge transfer devices, for transferring and supplying said reference charge signal and said input charge signals to a plurality of AD converters operating in parallel.

7. The filtering AD converter as claimed in claim 4, wherein, a charge signal routing mechanism is used as said charge signal processor, and charge signals which are input with a binary matching code supplied separately form a given exterior are grouped, and said correlation of said binary code string and said input signal series is parallelly calculated.

8. A filtering AD converter provided with a plurality of filtering converters as claimed in claim 4, wherein a global output is obtained as an output digital signal through the digital operation such as accumulative addition.

9. The filtering AD converter as claimed in claim 7, composed by integrating the demultiplexing mechanism constituting said parallel charge signal delivery system and said charge signal routing mechanism, so as to execute simultaneously the separation of reference signal and the grouping of charge signals according to said matching code.

* * * * *